Figure 1:
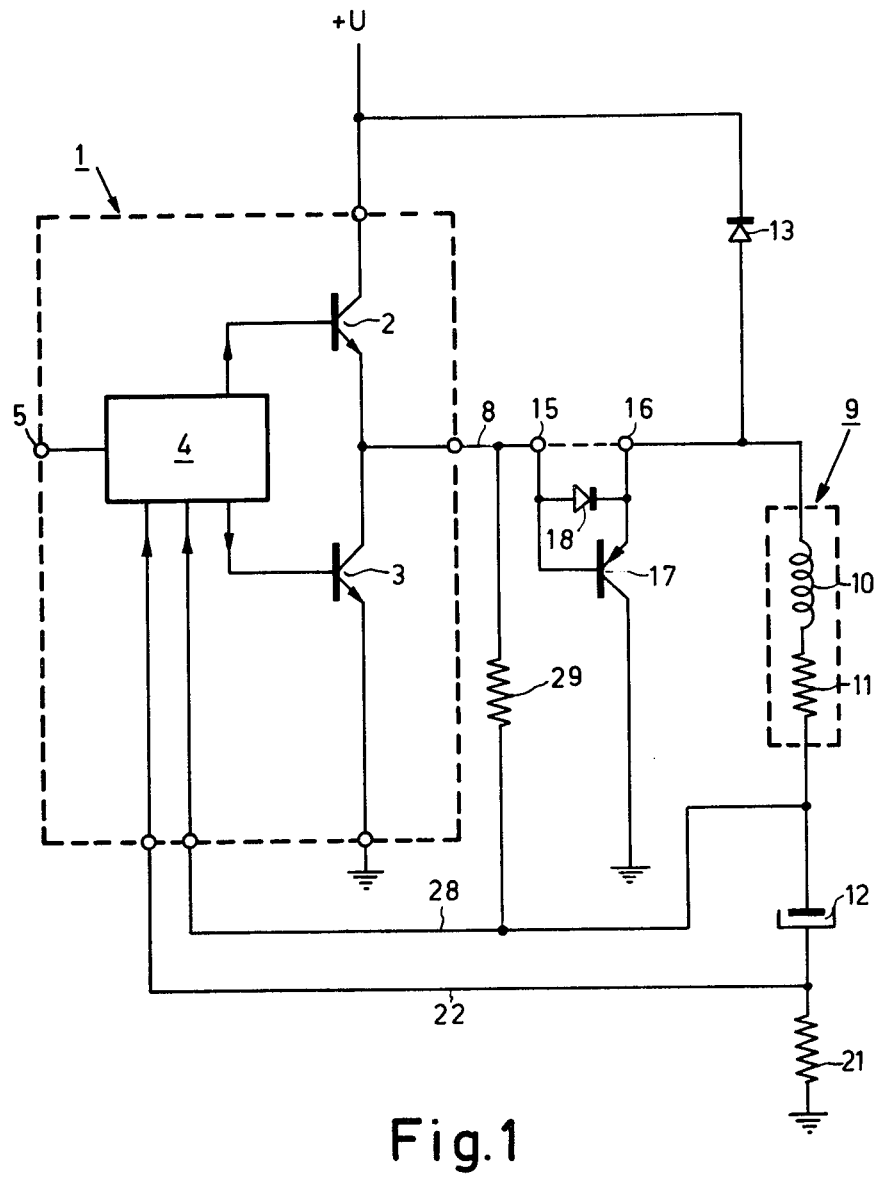

United States Patent [19]

Graffenberger et al.

[11] 4,028,630
[45] June 7, 1977

[54] PUSH-PULL AMPLIFIER ARRANGEMENT

[75] Inventors: Wilhelm Graffenberger; Gerd Onken, both of Hamburg, Germany

[73] Assignee: U.S. Philips Corporation, New York, N.Y.

[22] Filed: Feb. 23, 1976

[21] Appl. No.: 660,699

Related U.S. Application Data

[63] Continuation of Ser. No. 479,467, June 14, 1974, abandoned.

[30] Foreign Application Priority Data

June 23, 1973 Germany .......................... 2332092
Dec. 11, 1973 Germany .......................... 2361525
Mar. 8, 1974 Germany .......................... 2411108

[52] U.S. Cl. ................................ 330/15; 315/403; 330/17; 330/23; 330/26; 330/38 M
[51] Int. Cl.² .......................................... H03F 3/26
[58] Field of Search ........... 315/403; 328/183, 184, 328/187; 330/15, 18, 17, 23, 38 M

[56] References Cited

UNITED STATES PATENTS 3,056,064   9/1962   Bourget ........................ 315/403 X

*Primary Examiner*—Rudolph V. Rolinec
*Assistant Examiner*—Lawrence J. Dahl
*Attorney, Agent, or Firm*—Frank R. Trifari; Henry I. Steckler

[57] ABSTRACT

A push-pull B-stage in IC is arranged with an additional transistor in such a manner that one transistor in the IC and the additional transistor together constitute a new push-pull amplifier while the transistor in the IC is loaded to a higher extent and the other final stage transistor in the IC only serves as a driver for the additional transistor.

12 Claims, 3 Drawing Figures

PUSH-PULL AMPLIFIER ARRANGEMENT

This is a continuation, of application Ser. No. 479,467, filed June 14 1974, now abandoned.

The invention relates to an amplifier arrangement having a final stage comprising the series arrangement of a first and a second push-pull controllable transistor to whose connection point a load can be connected, and means for applying an input signal.

Particularly when such an amplifier is incorporated in an integrated circuit, it may be necessary to increase the power of the final stage. However, an integrated circuit can only stand a certain maximum dissipation.

When such an amplifier arrangement is incorporated in an integrated circuit with a push-pull class B output stage and further control stages for the vertical deflection in television display apparatus, the dissipation may be, for example, 7W at a maximum in a monochrome receiver, i.e. 2.8W for each final transistor. When this circuit arrangement is to be used for 110° colour television display apparatus, the dissipation must be higher due to the higher output power and must total approximately 12W, i.e. 5W for the transistor of the final stage, which is significantly more than the dissipation, for example, of 7W that can be taken up by the integrated circuit.

A further push-pull amplifier might be connected to the output for the integrated circuit suitable for a dissipation of 7W which amplifier is provided with separate and cooled transistors, but then two further power transistors would be required.

An object of the invention is to provide a circuit arrangement with which the desired higher dissipation can be obtained at low cost, which circuit arrangement is characterized in that a push-pull amplifier is formed from the first transistor and a third transistor, the second transistor supplying only the base current for the third transistor.

The first transistor which is active in the final stage of the original circuit arrangement must now be suitable for the higher dissipation, particularly the larger current, but when using the additional third transistor the second transistor of the original circuit arrangement which is now active as a driver is only loaded to a minimum. The original amplifier is thus invariably fully loaded so that the means provided for conducting away the heat are sufficient. Only for a part of the total power, namely for approximately half the final stage power, a single additional transistor is required. The original amplifier circuit is thus also usable for an output power which is almost twice as high while using only one additional power element.

In a special embodiment of the invention the circuit arrangement is characterized in that the connection point of the first and second transistors is connected at one end to the base of the third transistor whose collector is connected to a terminal of a voltage supply source and at the other end to the emitter of the third transistor through a diode whose conducting direction is opposite to the direction of the emitter base current of the third transistor to the emitter of which the load furthermore is connected.

The invention will hereinafter be described in greater detail with reference to three Figures of the drawing showing three embodiments.

In the integrated circuit shown by a broken line 1 in FIG. 1 two npn transistors 2 and 3 are arranged in series with respect to direct current between the positive terminal +U and the negative terminal, which may be connected to ground, of a voltage supply source. Their bases are connected to a drive circuit 4 rendering the transistors 2 and 3 alternately conducting and non-conducting in the rhythm of the drive signal. The drive signal is applied to the stage 4 from a terminal 5; for a vertical deflection stage of a television receiver it has at least substantially a sawtooth-shaped variation.

In the known circuit arrangements the load, i.e. the vertical deflection coil 9 with an inductive part 10 and a resistive part 11 of the television receiver not shown is connected through a lead 8 to the connection point of the transistors, for example, to the emitter of the transistor 2 and the collector of the transistor 3. The other end of the load is connected to ground through a DC isolation capacitor 12 of, for example, 2,200 $\mu$F. In order to establish the potential of the high positive voltage occurring during the retrace time at the coil 10, a diode 13 which conducts at the retrace voltage may be connected to the terminal +U of the supply source which establishes a connection with this terminal during the retrace interval for the current direction in which the transistor 2 cannot conduct. In addition further known circuit improvements may be introduced, such as, for example, a feedback from the current branch of capacitor 12 to the control circuit 4, or a circuit applying to the diode 13 during the retrace time a voltage which is higher than the supply voltage U.

In the known circuit arrangements the two transistors 2 and 3 are loaded to the same extent and supply the positive and negative current halves, respectively, to the load 9. According to the invention the connection lead 8 between the transistors 2 and 3 and the load 9 is separated at terminals 15 and 16. Terminal 15 is connected to the base of an additional pnp transistor 17, for example, of the Philips type BD 238 whose collector is connected to ground. Terminal 16 is connected to the emitter of transistor 17.

During the half cycle when the transistor 3 is conducting only the base current of transistor 17 flows through it and causes a corresponding current through its emitter-collector path in the load 9. The transistor 3 must therefore be driven by a smaller signal in accordance with the current amplification of transistor 17. This may already be taken into account in the input signal applied to the terminal 5. It is alternatively possible to apply a strong feedback from the load, for example, from a series resistor 21 of, for example, 0.4 Ohm through a lead 22 to the control circuit 4 so that then the correct current drive of the transistor 3 is automatically realized and results in the elimination of non-linearities, if any.

At the other polarity of the load current the transistor 3 and transistor 17 are cut off; the load current flows to its full extent through the transistor 2 and through a diode 18 conducting in case of this current direction which diode is connected in parallel with the base-emitter path of the transistor 17 between the terminals 15 and 16. During the retrace time the diode 13 conducts and applies the high positive voltage +U to the deflection coil 9.

For feedback of the DC bias a further stabilizing signal may be applied to the drive circuit 4 from the connection point of the deflection coil 9 and the capacitor 12 through a lead 28; a resistor 29 of, for example, 560 ohm may be connected between the lead 8 and the lead 28 which resistor passes on a signal from terminal 15 to the lead 28.

When the integrated circuit 1 is operated without the additional transistor 17, the transistors 2 and 3 can stand a dissipation of, for example, 2.8 Watt each and apply a corresponding useful power to the load 9. It is achieved by the transistor 17 and the diode 18 that the transistor 2 and the transistor 17 can be loaded with, for example, 5 Watts each so that a power which is almost twice as high can be applied to the load 9. It is true that the transistor 2 is loaded to a greater extent, but since the transistor 3 is loaded to a correspondingly lesser extent, the dissipation in the integrated circuit remains within the admissible limits.

It is alternatively possible to connect the transistor 17 with the positive terminal of the supply source instead of with the negative terminal. In that case an npn transistor must be used and the polarity of the diode 18 is to be reversed. Due to the additional transistor 17 the upper transistor 2 is not loaded and is only used as a driver while transistor 3 processes a higher power. The drive signal must of course be adapted, possibly by means of a feedback.

It has been found that the drive signal 5 and the load current are no longer a linear function of each other when transistor 2 and transistor 7 substantially do not convey any current upon current changeover between them, i.e. when the polarity of the current is reversed so that accordingly also the load 9 does not substantially convey any current. Both transistors are then substantially simultaneously cut off in a range of their control voltage of approximately 0.5 to 1.5 V so that the drive signal has no effect upon the output. A distortion of the sawtooth-shaped deflection current may then be the result.

Figure 2:
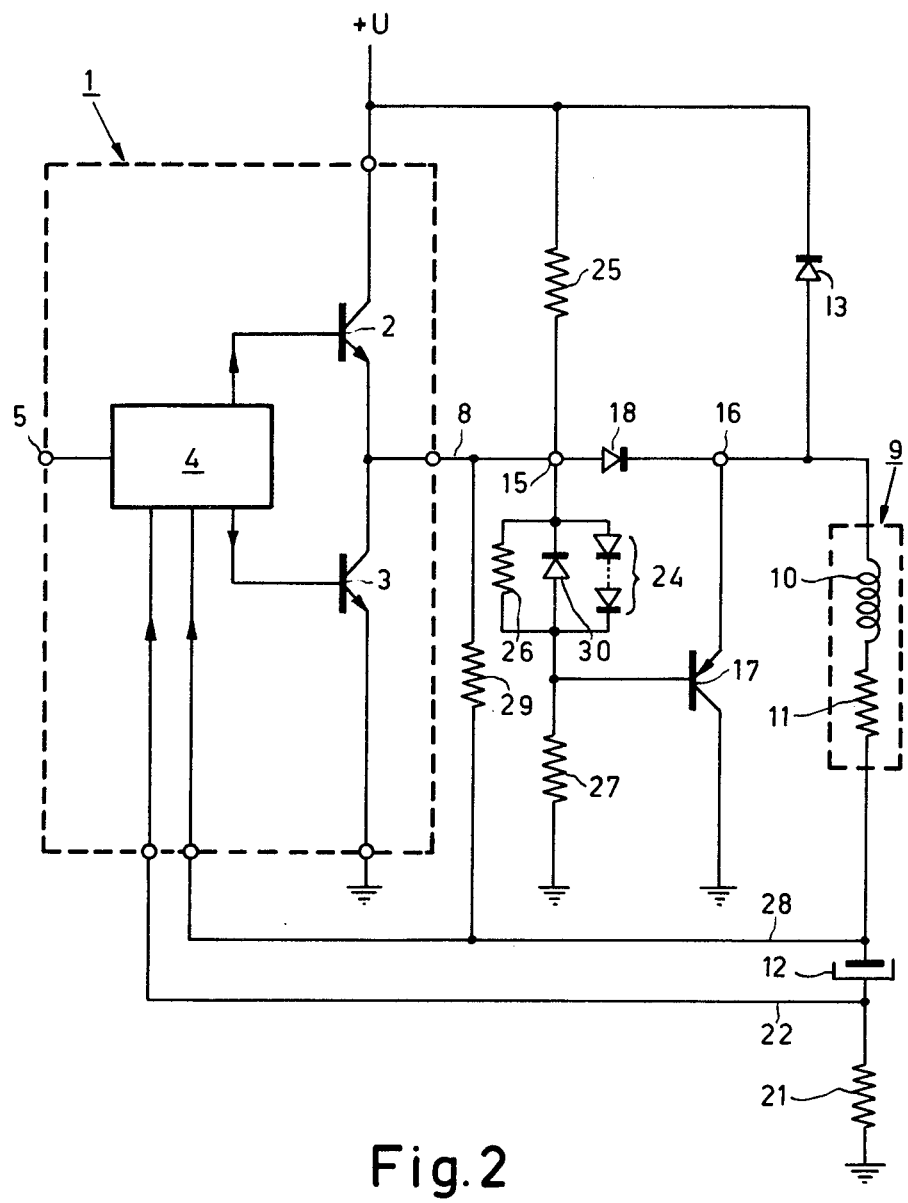

In the embodiment according to FIG. 2 this is obviated in that the terminal 15 is not directly connected to the base of transistor 15 as is shown in FIG. 1, but in that it is ensured that a voltage difference exists between these two points which difference corresponds approximately to the sum of the voltage drop across the diode 18 in case of a current flowing therethrough and the initial value of the emitter base voltage of transistor 17 which both amount to approximately 0.6 V. It is then ensured that the two transistors 2 and 17 are simultaneously slightly conducting at the initiation of their characteristic so that a smooth changeover of the current from one to the other transistor is realized.

The voltage difference may be obtained by a voltage stabilizing element 24, for example, a stabistor which is, a component formed from a number of series-arranged semiconductor diodes conducting current in the pass direction or two diodes arranged in series in the pass direction to which current is applied, for example from the positive terminal of the supply source through a resistor 25 and a resistor 27 to the negative terminal of the supply source. When the supply voltage is +30V a current of 10 mA is obtained through the resistors 25 and 27 when both have a value of 1.5 kOhm.

When the transistor 17 conveys emitter-collector current a base current must flow which is opposite to the bias current through the stabistor 24. For this base current a resistor 26 is arranged in parallel with the stabistor. This resistor must have such a high value that it does not affect the stabilizing action of the stabistor 24; on the other hand it must have such a low value that it can convey without any disturbing voltage drop the base current of the transistor 17 which current may be for example 35 mA for an emitter-collector current of 1.2 A. A. value of 220 Ohm has proved to be suitable in the circuit shown.

When a current flows through the base of the transistor 17 the voltage difference between the lead 8 and the base of transistor 17 is maintained when the bias current which is supplied through the resistors 25 and 27 or other suitable equivalent current sources is larger than the maximum base drive current of the transistor 17. Otherwise part of the base drive current flows through the resistor 26. The voltage drop occurring at this resistor may be limited in that a diode 30 is connected in parallel therewith which is conducting for this base current and whose conducting direction thus is opposite to that of the stabistor 24. The base current of the transistor 17 may alternatively be supplied through a capacitor of, for example, 2000 µF arranged in parallel with the stabistor 24. In this case the resistor 26 is not required.

Since the current change-over from one polarity (through transistor 2) to the other polarity (through transistor 17) is to be equalized by the stabistor 24, said stabilisation of the voltage between the lead 8 and the base of transistor 17 need only be active when the load current is zero or very small. In case of a higher load current through the transistor 17 due to a larger base current through the resistor 26 a gradual shift of the characteristic occurs which is hardly significant, however, since it can easily be equalized to a sufficient extent by a suitable form of the drive signal at the terminal 5 or by the action of the feedback 22 and/or 28.

Figure 3:
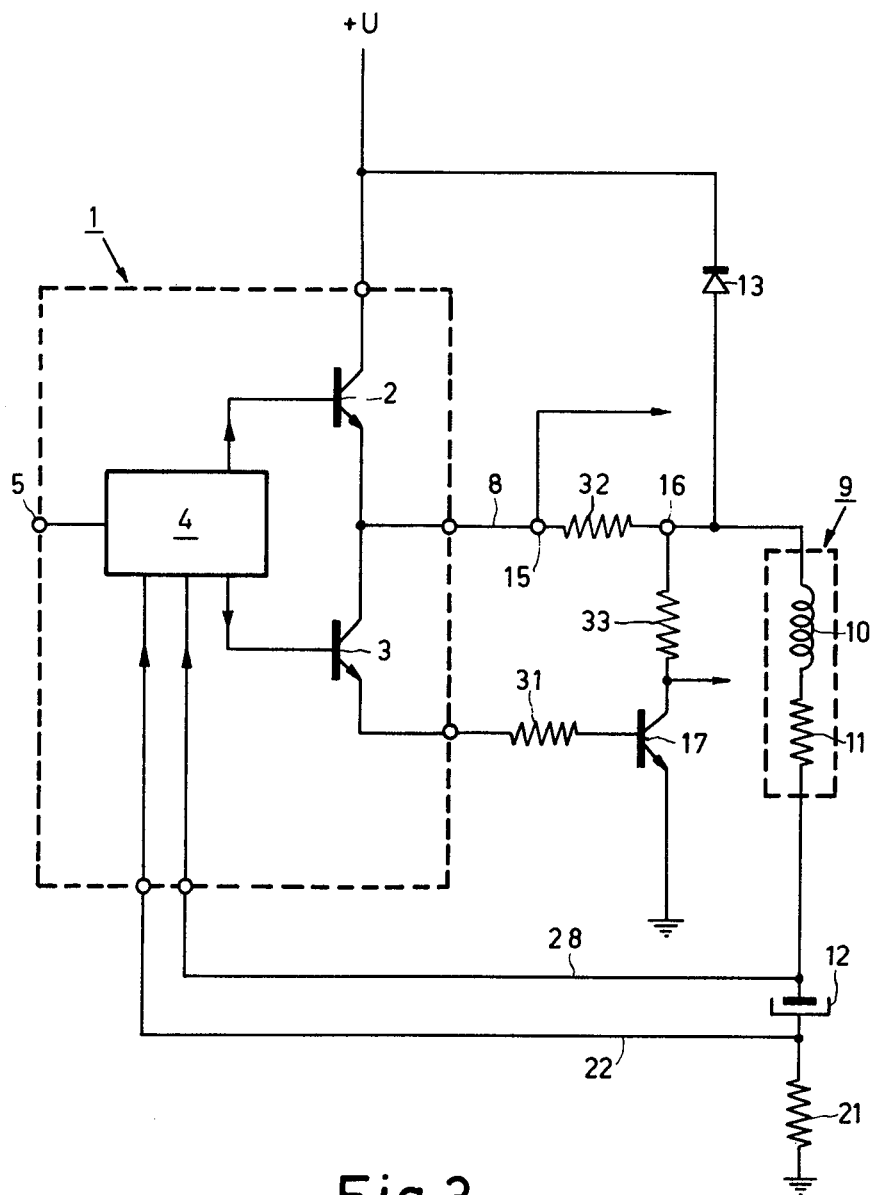

In the further embodiment of FIG. 3 the collector of transistor 17 is connected to a lead 8 and the emitter is connected to ground. Likewise as transistor 3, transistor 17 is of the npn type, for example, of the Philips type BD 201 and its base is connected through a resistor 31 to the emitter of transistor 3. If the circuit arrangement is operated without the additional transistor 17 and consequently with a lower output power, the emitter of transistor 3 is connected to ground. In the circuit arrangement shown in FIG. 3 this emitter is connected to the base of transistor 17 so that a Darlington arrangement is produced in which the transistor 3 only serves as a driver for transistor 17. The resistor 31 may be essential for preventing interference oscillations. It may also serve to increase the input resistance at the base of transistor 3 since this transistor has to be driven to a lesser extent by the circuit 4, particularly in case of voltage control, corresponding to its new task as a driver.

At the polarity of the load current at which the transistors 3 and 17 are cut off/the load current flows to its full extent through the transistor 2 so that the diode 18 in FIGS. 1 and 2 is not necessary. Difficulties which may occur in the range in which the low current is substantially zero and in which it changes from the diode to the transistor or conversely are thus prevented.

It is principally alternatively possible to introduce the further transistor 17 in the Darlington circuit together with the first transistor 2. This would, however, require an additional connection contact for the emitter of transistor 2, this emitter being separated from the collector of transistor 3.

In the circuit shown in FIG. 3 the current contact used for the emitter of transistor 3 may serve without additional steps for connection to the base of transistor 17.

A modification of the embodiment shown in FIG. 3 is the one in which the transistors 2 and 3 are of opposite types. For example, transistor 2 may be an npn transistor whereas transistor 3 is a pnp transistor and both emitters are connected together. The electrode of transistor 3 applying the base current to the transistor 17 then is the collector.

In many circuits it is necessary to obtain two phase-opposed voltages with respect to the upper connection point of the deflection coil 9, for example, for control and/or for correction on the deflection. This is simply possible in FIG. 3 in that the lead 8 includes a resistor 32 and the collector lead of transistor 17 includes a resistor 33. The resistors may have values of, for example, 0.47 Ohm each. The two phase-opposed voltages can then be derived at the points shown by arrows.

It will be evident that the described steps according to the invention need not be limited to a vertical deflection stage. It is obvious that it may alternatively be used with other push-pull class B amplifiers, for example, for sound reproduction.

What is claimed is:

1. An amplifier circuit arrangement comprising a first and a second push-pull controllable transistor both disposed in a monolithic semiconductor body, a connection terminal point coupled to said transistors to which a load can be connected, means for applying an input signal to said transistors, and a push-pull output amplifier comprising the first transistor and a third transistor disposed outside of said body, the second transistor supplying only the base current for the third transistor.

2. A circuit arrangement as claimed in claim 1, wherein the connection point between the first and second transistors is connected to the base of the third transistor, the collector of said third transistor being connected to a terminal of a voltage supply source, and further comprising a diode whose conductivity direction is opposite to the direction of the emitter-base current of the third transistor coupled between the emitter of said third transistor and said connection point.

3. A circuit arrangement as claimed in claim 2, further comprising means for obtaining in the range of the current changeover from the first transistor to the third transistor a substantially constant voltage is active between the electrode of the diode connected to the connection point of the first and second transistors and the base of the third transistor, which voltage is at least substantially the sum of the forward voltage at the diode and the base-emitter voltage occurring in the conducting interval of the third transistor.

4. A circuit arrangement as claimed in claim 3, wherein said obtaining means comprises a stabistor, and means for applying a bias current to said stabistor from the terminals of a voltage supply source.

5. A circuit arrangement as claimed in claim 4, wherein said applying means comprises resistors.

6. A circuit arrangement as claimed in claim 4, wherein the bias current is larger than the maximum base drive current of the third transistor.

7. A circuit arrangement as claimed in claim 6, further comprising a diode means parallel coupled to said resistor means for passing the base current of said third transistor.

8. A circuit arrangement as claimed in claim 4, further comprising a resistor means parallel coupled to said stabistor for taking over the base current of the third transistor.

9. A circuit arrangement as claimed in claim 4, further comprising a capacitor with a large capacitance is connected in parallel to the stabistor.

10. A circuit arrangement as claimed in claim 1, further comprising means for coupling the output electrode of the second transistor remote from the connection point of the first and second transistors to the base of the third transistor, the collector of said third transistor collector being connected to the connection point of the first and second transistors, the emitter of said third transistor being connected to a terminal of a voltage supply source.

11. A circuit as claimed in claim 10, wherein said coupling means comprises a resistor.

12. A circuit arrangement as claimed in claim 10, wherein at least one of the leads connected to the connection point of the first and second transistor and the collector lead of the third transistor includes a resistor.

* * * * *